United States Patent
Ishii et al.

(10) Patent No.: US 11,594,668 B2
(45) Date of Patent: Feb. 28, 2023

(54) THIN FILM LAMINATE, THIN FILM DEVICE AND MULTILAYER SUBSTRATE

(71) Applicant: TDK Corporation, Tokyo (JP)

(72) Inventors: Kenta Ishii, Tokyo (JP); Masaru Nanao, Tokyo (JP); Hitoshi Sakuma, Tokyo (JP); Takao Noguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 477 days.

(21) Appl. No.: 16/719,009

(22) Filed: Dec. 18, 2019

(65) Prior Publication Data

US 2020/0212286 A1 Jul. 2, 2020

(30) Foreign Application Priority Data

Dec. 28, 2018 (JP) .................................. 2018-247316
Sep. 30, 2019 (JP) ............................. JP2019-180009

(51) Int. Cl.
| | | |
|---|---|---|
| H01L 41/04 | (2006.01) | |
| H01L 41/047 | (2006.01) | |
| H01L 41/08 | (2006.01) | |
| C23C 16/48 | (2006.01) | |
| C23C 16/06 | (2006.01) | |
| C23C 14/08 | (2006.01) | |
| C23C 14/34 | (2006.01) | |
| C23C 16/40 | (2006.01) | |
| H01L 41/187 | (2006.01) | |

(52) U.S. Cl.
CPC ........ *H01L 41/0477* (2013.01); *C23C 14/088* (2013.01); *C23C 14/34* (2013.01); *C23C 16/06* (2013.01); *C23C 16/405* (2013.01); *C23C 16/487* (2013.01); *H01L 41/0815* (2013.01); *H01L 41/187* (2013.01)

(58) Field of Classification Search
None
See application file for complete search history.

(56) References Cited

U.S. PATENT DOCUMENTS

| | | |
|---|---|---|
| 6,599,757 B1 | 7/2003 | Murai |
| 2002/0006733 A1 | 1/2002 | Noguchi et al. |
| 2002/0123158 A1 | 9/2002 | Murai |

(Continued)

FOREIGN PATENT DOCUMENTS

| | | |
|---|---|---|
| JP | H11-214507 A | 8/1999 |
| JP | 2001-088294 A | 4/2001 |

(Continued)

*Primary Examiner* — Erica S Lin
(74) *Attorney, Agent, or Firm* — Faegre Drinker Biddle & Reath LLP (57) ABSTRACT

A thin film laminate comprises a metal layer consisting of a metal, and a thin film laminated on the surface of the metal layer, wherein a first direction is defined as one direction parallel to the surface of the metal layer, and a second direction is defined as one direction parallel to the surface of the metal layer and crossing the first direction; and the metal layer contains a plurality of first metal grains consisting of the metal and extending in the first direction on the surface of the metal layer, and a plurality of second metal grains consisting of the metal and extending in the second direction on the surface of the metal layer.

12 Claims, 4 Drawing Sheets

(56) References Cited

U.S. PATENT DOCUMENTS

| | | | |
|---|---|---|---|
| 2002/0160305 A1* | 10/2002 | Horie | G11B 7/0062 |
| | | | 430/270.13 |
| 2003/0071878 A1 | 4/2003 | Murai | |
| 2003/0090550 A1 | 5/2003 | Murai | |
| 2003/0092203 A1 | 5/2003 | Murai | |
| 2004/0173823 A1 | 9/2004 | Murai | |
| 2005/0046312 A1* | 3/2005 | Miyoshi | H01L 41/273 |
| | | | 310/366 |
| 2008/0303377 A1 | 12/2008 | Oka et al. | |
| 2015/0030846 A1 | 1/2015 | Kijima et al. | |
| 2016/0163960 A1* | 6/2016 | Kato | C04B 35/495 |
| | | | 310/365 |
| 2017/0170384 A1 | 6/2017 | Kijima et al. | |

FOREIGN PATENT DOCUMENTS

| | | | |
|---|---|---|---|
| JP | 2001-313429 A | 11/2001 | |
| JP | 2007-148034 A | 6/2007 | |
| JP | 2008-305916 A | 12/2008 | |
| JP | 2015-025166 A | 2/2015 | |

\* cited by examiner

THIN FILM LAMINATE, THIN FILM DEVICE AND MULTILAYER SUBSTRATE

TECHNICAL FIELD

The present invention relates to a thin film laminate, a thin film device and a multilayer substrate.

BACKGROUND

In recent years, practical use of dielectric thin film devices using thin films of dielectric materials in place of bulky dielectric materials has progressed. (See Japanese Unexamined Patent Publication Nos. 2008-305916, 2001-88294, 2015-25166, 2001-313429.) As one example of the dielectric thin film devices, piezoelectric thin film devices using thin films of piezoelectric materials (piezoelectric thin films) are known. In piezoelectric thin film devices utilizing the direct piezoelectric effect, when a stress is applied to the piezoelectric thin films to strain the piezoelectric thin films, a voltage proportional to the strain amount of the piezoelectric thin films is generated. The piezoelectric thin film devices utilizing the direct piezoelectric effect are, for example, gyro sensors, pressure sensors, pulse wave sensors, shock sensors and microphones. On the other hand, in piezoelectric thin film devices utilizing the inverse piezoelectric effect, when a voltage is applied to the piezoelectric thin films, a mechanical strain proportional to the voltage magnitude is generated in the piezoelectric thin films. The piezoelectric thin film devices utilizing the inverse piezoelectric effect are, for example, actuators, head sliders of hard disc drives, printer heads of inkjet printers, speakers, buzzers and resonators.

Thinner piezoelectric thin films make more possible the size reduction of piezoelectric thin film devices and the fields where the piezoelectric thin film devices can be applied expand. By collectively forming a large number of piezoelectric thin film devices on a substrate, the mass productivity of the piezoelectric thin film devices is improved. Thinner piezoelectric thin films make more possible the improvement of the performance of the piezoelectric thin film devices. For example, in the case of sensors having a piezoelectric thin film, the thinner piezoelectric thin film brings about more improved sensitivity of the sensors.

SUMMARY

A piezoelectric thin film which a piezoelectric thin film device has is formed on the surface of a metal layer (electrode layer). In either case of the direct piezoelectric effect and the inverse piezoelectric effect, there is a possibility that the piezoelectric thin film is peeled off from the metal layer accompanying a strain of the piezoelectric thin film. The peeling-off of the piezoelectric thin film from the metal layer impairs the performance (for example, voltage withstandability) of the piezoelectric thin film device. The cause of the peeling-off of the piezoelectric thin film is not limited to the strain of the piezoelectric thin film. A residual stress acts on the thin film or the metal layer due to the lattice mismatch between the thin film and the metal layer or the difference in thermal expansion coefficient between the thin film and the metal layer. The thin film may be peeled off from the metal layer due to the residual stress. When a stress caused by an external force acts on the thin film or the metal layer, the thin film may also be peeled off from the metal layer.

Peeling-off of the thin film from metal layer as seen in the above is not a problem peculiar to piezoelectric thin film devices. Every thin film laminate having a metal layer and a thin film laminated on the surface of the metal layer has a possibility that the thin film is peeled off from the metal layer for the above reason. For example, also when thin film consists of a pyroelectric material or a ferroelectric material, there is a possibility that the thin film is peeled off from metal layer. Optical devices such as ND filters (Neutral Density filters), optical switching devices and optical waveguide devices are also thin film laminates, and also in these optical devices, thin films have possibility of being peeled off from metal layers.

The present invention has an object to provide a thin film laminate in which peeling-off of a thin film from a metal layer is suppressed, a thin film device comprising the thin film laminate, and a multilayer substrate comprising the thin film laminate.

A thin film laminate according to one aspect of the present invention comprises a metal layer consisting of a metal, and a thin film laminated on the surface of the metal layer, wherein a first direction is defined as one direction parallel to the surface of the metal layer, and a second direction is defined as one direction parallel to the surface of the metal layer and crossing the first direction; and the metal layer contains a plurality of first metal grains consisting of the metal and extending in the first direction on the surface of the metal layer and a plurality of second metal grains consisting of the metal and extending in the second direction on the surface of the metal layer.

The width of the first metal grain in the first direction may be represented as L1, and the width of the first metal grain in a direction parallel to the surface of the metal layer and perpendicular to the first direction may be represented as S1; the width of second metal grain in the second direction may be represented as L2, and the width of the second metal grain in a direction parallel to the surface of the metal layer and perpendicular to the second direction may be represented as S2; and the average value of L1/S1 of the plurality of first metal grains may be 1.5 or more and 20 or less, and the average value of L2/S2 of the plurality of second metal grains may be 1.5 or more and 20 or less.

The metal layer may contain at least one selected from the group consisting of platinum, iridium, osmium, rhenium, palladium, ruthenium, rhodium, cobalt, nickel, gold and silver.

The first metal grains may be first crystals consisting of the above metal, and the second metal grains may be second crystals consisting of the above metal.

(100) planes of at least part of the first crystals may be oriented in the normal direction of the surface of the metal layer, and (100) planes of at least part of the second crystals may be oriented in the normal direction of the surface of the metal layer.

The thin film may contain a dielectric material.

The dielectric material may be one selected from the group consisting of a paraelectric material, a piezoelectric material, a pyroelectric material and a ferroelectric material.

The dielectric material may be a metal oxide having a perovskite structure.

The thin film may be an epitaxial film.

The metal layer may be a first electrode layer, and the thin film laminate may further comprise a second electrode layer laminated on the surface of the thin film.

The angle made by the first direction and the second direction may be 90°.

A thin film laminate according to one aspect of the present invention may comprise a substrate, an adhesion layer laminated on the surface of the substrate, the metal layer laminated on the surface of the adhesion layer, and the thin film laminated on the surface of the metal layer, wherein the adhesion layer may contain zirconium oxide and an oxide of a rare earth element.

A thin film device according to one aspect of the present invention may comprise the above thin film laminate.

A multilayer substrate according to one aspect of the present invention may comprise the above thin film laminate, and may be used for production of the thin film device.

According to the present invention, there are provided the thin film laminate in which peeling-off of the thin film from the metal layer is suppressed, the thin film device comprising the thin film laminate, and the multilayer substrate comprising the thin film laminate.

DETAILED DESCRIPTION

Hereinafter, preferred embodiments of the present invention will be described by reference to the drawings. In the drawings, the same reference sign is attached to the same constituent. The present invention is not limited to the following embodiments. X, Y and Z shown in each drawing mean three coordinate axes orthogonally intersecting one another. The respective directions indicated by the X, Y and Z coordinate axes in each drawing are common to the drawings.

Figure 1:
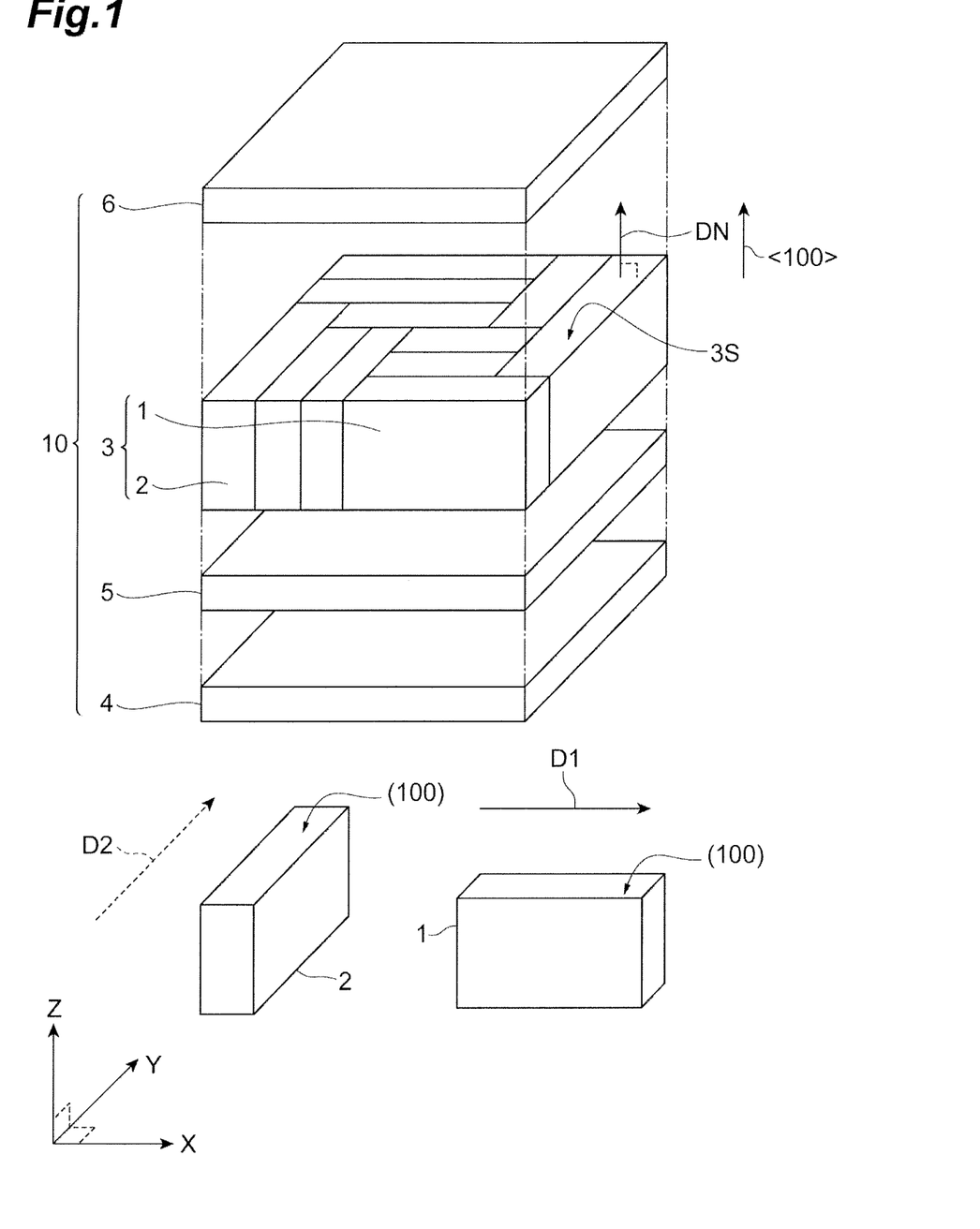
FIG. 1 is an exploded perspective view of a thin film laminate (thin film device) according to one embodiment of the present invention.
Figure 2:
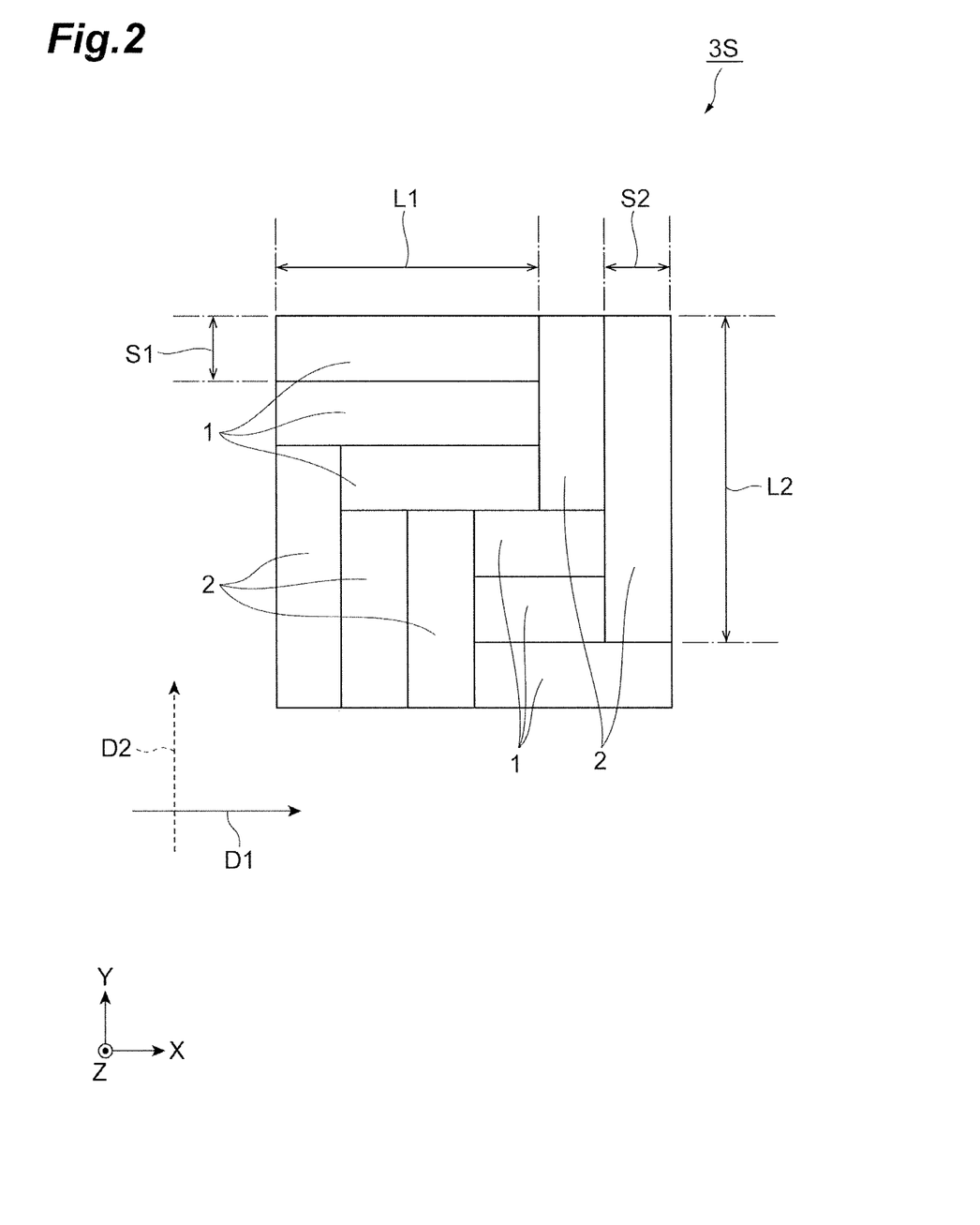
FIG. 2 is a schematic view of the surface of a metal layer which the thin film laminate illustrated in FIG. 1 has.

As shown in FIG. 1 and FIG. 2, a thin film laminate 10 according to the present embodiment has a metal layer 3 consisting of a metal, and a thin film 6 laminated directly on the surface 3S of the metal layer 3. The thin film laminate 10 may further have a substrate 4, and an adhesion layer 5 laminated directly on the surface of the substrate 4, and the metal layer 3 may be laminated directly on the surface of the adhesion layer 5. The thin film 6 may cover a part or the whole of the surface 3S of the metal layer 3. The metal layer 3 may cover a part or the whole of the adhesion layer 5. The adhesion layer 5 may cover a part or the whole of the surface of the substrate 4. The thin film laminate 10 may not have the adhesion layer 5, and the metal layer 3 may be laminated directly on the surface of the substrate 4. The shape of each of the substrate 4, the adhesion layer 5, the metal layer 3 and the thin film 6 may be a thin rectangular parallelepiped (flat rectangle). However, the shape of each of the substrate 4, the adhesion layer 5, the metal layer 3 and the thin film 6 is not limited to a thin rectangular parallelepiped. The details of each of the substrate 4 and the adhesion layer 5 will be described later.

Figure 4:
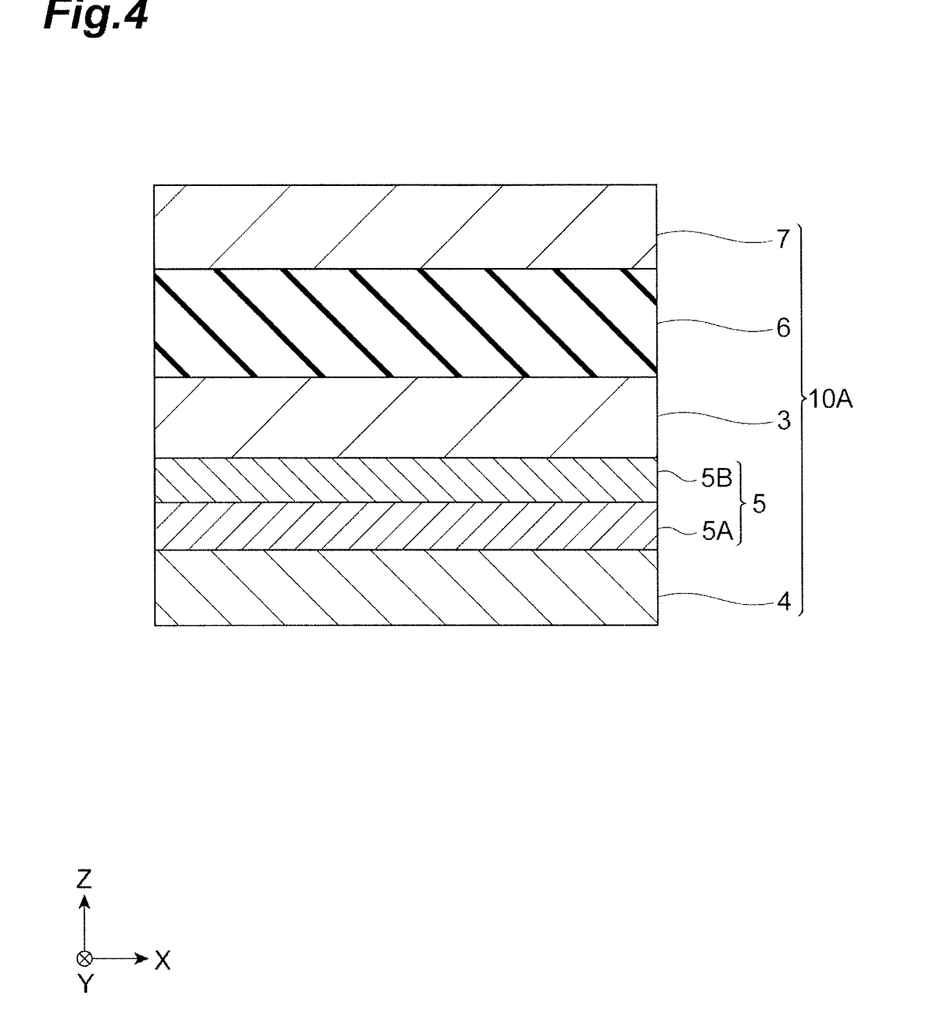
FIG. 4 is a cross-sectional view of a thin film laminate (thin film device) according to another embodiment of the present invention, and is a cross-sectional view perpendicular to the surface of the metal layer.

The metal layer 3 may be an electrode layer. When the metal layer 3 is a first electrode layer, the thin film laminate 10 may further have a second electrode layer. For example, as shown in FIG. 4, a thin film laminate 10A may have a substrate 4, an adhesion layer 5 laminated directly on the surface of the substrate 4, a metal layer 3 (first electrode layer) laminated directly on the surface of the adhesion layer 5, a thin film 6 laminated directly on the surface 3S of the metal layer 3, and a second electrode layer 7 laminated directly on the surface of the thin film 6. The second electrode layer 7 may cover a part or the whole of the surface of the thin film 6.

As shown in FIG. 1 and FIG. 2, the first direction D1 is defined as one direction parallel to the surface 3S of the metal layer 3. As shown in FIG. 1 and FIG. 2, the second direction D2 is defined as one direction parallel to the surface 3S of the metal layer 3 and crossing the first direction D1. In other words, the second direction D2 is defined as a direction parallel to the surface 3S of the metal layer 3 and not parallel to the first direction D1.

As shown in FIG. 1 and FIG. 2, the metal layer 3 contains a plurality of first metal grains 1 and a plurality of second metal grains 2. The first metal grains 1 and the second metal grains 2 each consist of a metal constituting the metal layer 3. Each of the first metal grains 1 extends along the first direction D1 on the surface 3S of the metal layer 3. That is, each of the first metal grains 1 has a long and narrow shape on the surface 3S of the metal layer 3, and the long side of each of the first metal grain 1 on the surface 3S of the metal layer 3 is approximately parallel to the first direction D1. Each of the second metal grains 2 extends along the second direction D2 on the surface 3S of the metal layer 3. That is, each of the second metal grains 2 has a long and narrow shape on the surface 3S of the metal layer 3, and the long side of each of the second metal grain 2 on the surface 3S of the metal layer 3 is approximately parallel to the second direction D2. The plurality of the first metal grains 1 may be arranged along the first direction D1 on the surface 3S of the metal layer 3, and the plurality of the second metal grains 2 may be arranged along the second direction D2 on the surface 3S of the metal layer 3. The first metal grains 1 and the second metal grains 2 may be arranged alternately.

Figure 3:
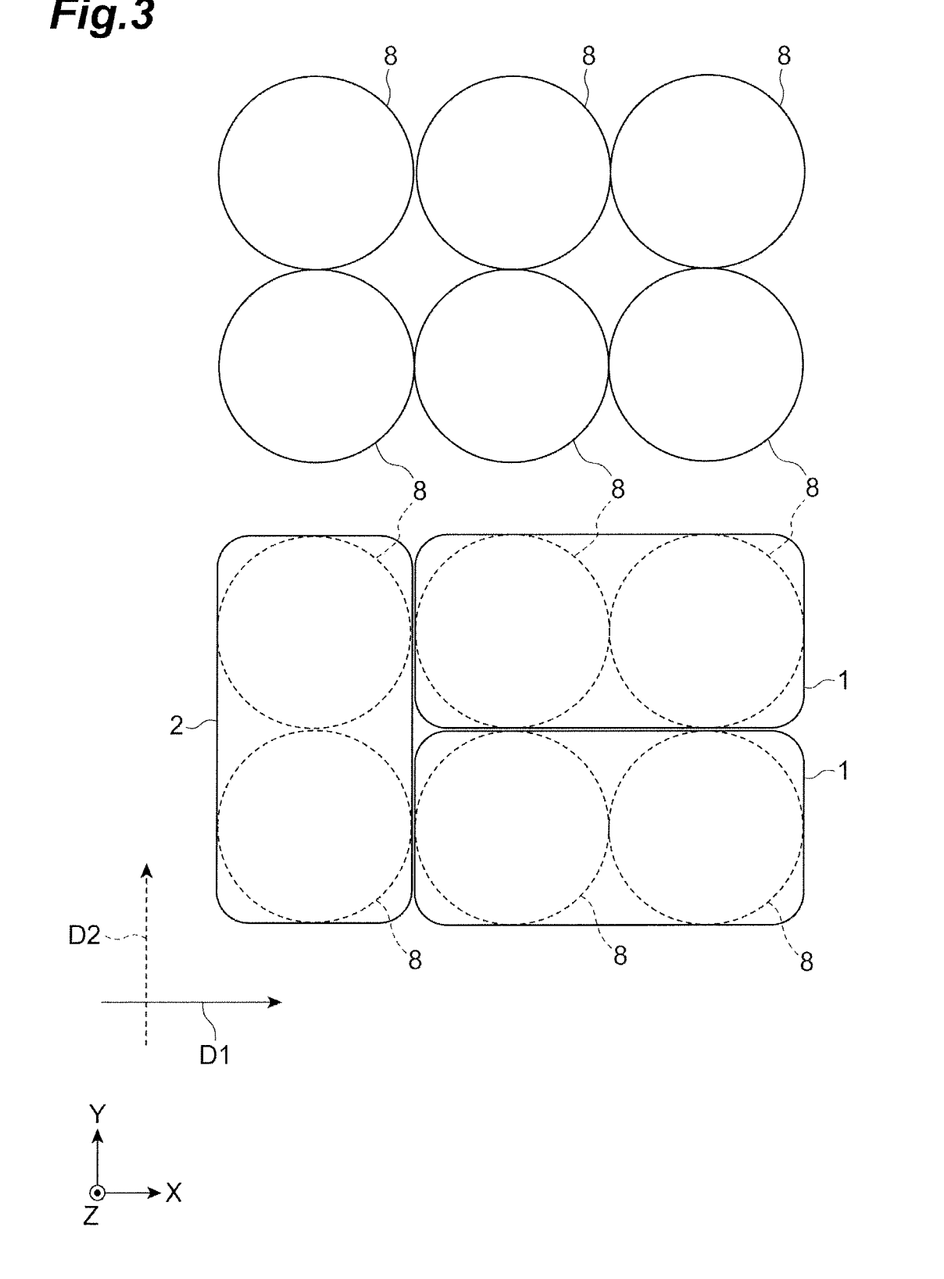
FIG. 3 is a schematic view of first metal grains and second metal grains exposed on a surface of the metal layer.

As described later, the metal layer 3 is formed on the surface of the adhesion layer 5 or the surface of the substrate 4 by a vapor phase growth method. As shown in FIG. 3, in the early stage of the formation process of the metal layer 3, a metal is vapor-deposited on the surface of the adhesion layer 5 or the surface of the substrate 4, and a large number of crystal seeds are formed from the metal. Each crystal seed, by being heated under a predetermined temperature condition described later, grows to a crystal grain 8 (domain), and neighboring crystal grains 8 are connected. As a result, the first metal grain 1 and the second metal grain 2 are each formed. If the first metal grain 1 and the second metal grain 2 are not formed, gaps are liable to be formed between the large number of crystal grains 8 constituting the metal layer 3. That is, pinholes or grain boundaries extending along the normal direction DN of the surface 3S of the metal layer 3 are liable to be formed in the metal layer 3. For example, when the shape of each of the crystal grain 8 on the surface 3S of the metal layer 3 is approximated by a circle, even if a plurality of circles are compactly arranged on the surface 3S of the metal layer 3, gaps can be formed between neighboring circles. As a result of the formation of gaps between neighboring crystal grains 8, the surface area of the metal layer 3 contacting with the thin film 6 is reduced as compared with when the first metal grains 1 and the second metal grains 2 are formed. Since the surface area of the metal layer 3 contacting with the thin film 6 is small, the thin film 6 is unlikely to be adhered to the metal layer 3, and the thin film 6 is easily peeled off from the metal layer 3. When the thin film 6 contains a dielectric material, gaps between the thin film 6 and the metal layer 3 are liable to become paths of leak current. That is, noncontact of the metal layer 3 with the thin film 6 causes the leak current in the thin film 6. Therefore, accompanying the reduction of the surface area of the metal layer 3 contacting with the thin film 6, the leak current in the thin film 6 is liable to be generated. By contrast, by arrangement of the first metal grains 1 and second metal grains 2 extending in different directions on the surface 3S of the metal layer 3, gaps between the neighboring first metal grains 1 are unlikely to be formed; gaps between the neighboring second metal grains 2 are unlikely to be formed; and gaps between the neighboring first metal grains 1 and second metal grains 2 are also unlikely to be formed. Consequently, as compared with when the metal layer 3 is constituted of a large number of crystal grains 8, the metal layer 3 is easy to be compact, and the surface area of the metal layer 3 contacting with the thin film 6 is easily increased. By the increase of the surface area of the metal layer 3 contacting with the thin film 6, the thin film 6 is easily adhered to the metal layer 3, and the thin film 6 is unlikely to be peeled off from the metal layer 3. When the thin film 6 contains a dielectric material, accompanying the increase of the surface area of the metal layer 3 contacting with the thin film 6, the leak current in the thin film 6 is easily suppressed.

As described above, there is a possibility that a residual stress caused by the lattice mismatch between the thin film 6 and the metal layer 3, or a residual stress caused by the difference in thermal expansion coefficient between the thin film 6 and the metal layer 3 acts on the metal layer 3. There is also a possibility that a residual stress caused by the lattice mismatch between the adhesion layer 5 and the metal layer 3, or a residual stress caused by the difference in thermal expansion coefficient between the adhesion layer 5 and the metal layer 3 acts on the metal layer 3. There is also a possibility that a residual stress caused by the lattice mismatch between the substrate 4 and the metal layer 3, or a residual stress caused by the difference in thermal expansion coefficient between the substrate 4 and the metal layer 3 acts on the metal layer 3. There is a possibility that the thin film 6 is peeled off from the metal layer 3 due to these stresses. There is also a possibility that a stress caused by an external force acts on the thin film 6 and the metal layer 3, and that the thin film 6 is peeled off from the metal layer due to the stress. There is also a possibility that a stress caused by a strain or a displacement of the thin film 6 itself, and that the thin film 6 is peeled off from the metal layer 3 due to the stress. If the metal layer 3 consists of a plurality of the first metal grains 1 only, the metal layer 3 can be expanded and contracted in the first direction D1, and the metal layer 3 has a mechanical strength (durability) against a stress in the first direction D1. However, when the metal layer 3 consists of the plurality of the first metal grains 1 only, the metal layer 3 is unlikely to be expanded and contracted in a direction different from the first direction D1. Therefore, when the metal layer 3 consists of the plurality of the first metal grains 1 only, a stress whose direction is different from the first direction D1 acts on the metal layer 3, and the metal layer 3 is easily broken at the interfaces between the first metal grains 1 due to the stress. Accompanying breakage of the metal layer 3, the thin film 6 is easily peeled off from the metal layer 3. On the other hand, when the metal layer 3 consists of a plurality of the second metal grains 2 only, a stress whose direction is different from the second direction D2 acts on the metal layer 3, and the metal layer 3 is easily broken at the interfaces between the second metal grains 2 due to the stress. Accompanying breakage of the metal layer 3, the thin film 6 is easily peeled off from the metal layer 3. However, by arrangement of the first metal grains 1 and second metal grains 2 extending in different directions, stresses in every direction on the surface 3S of the metal layer 3 are easily relaxed in the first direction D1 and the second direction D2. Consequently, strain and breakage of the metal layer 3 are suppressed and peeling-off of the thin film 6 from the metal layer 3 is also suppressed.

The reason that peeling-off of the thin film 6 from the metal layer 3 is suppressed is not limited to the above mechanism. According to the present embodiment, regardless of the composition and the physical properties of the thin film 6, the peeling-off of the thin film 6 from the metal layer 3 can be suppressed. When the thin film laminate 10 is a dielectric thin film device, the thin film laminate 10 according to the present embodiment is relatively excellent in that the peeling-off of the dielectric thin film from the metal layer is easily suppressed. When the thin film laminate 10 is a piezoelectric thin film device, the thin film laminate 10 according to the present embodiment is especially excellent in that the peeling-off of the piezoelectric thin film from the metal layer is easily suppressed.

As shown in FIG. 2, the width (maximum width) of the first metal grain 1 in the first direction D1 may be represented as L1. The width (maximum width) of the first metal grain 1 in the direction parallel to the surface 3S of the metal layer 3 and perpendicular to the first direction D1 may be represented as S1. The width (maximum width) of the second metal grain 2 in the second direction D2 may be represented as L2. The width (maximum width) of the second metal grain 2 in the direction parallel to the surface 3S of the metal layer 3 and perpendicular to the second direction D2 may be represented as S2. Any of L1, S1, L2 and S2 may be measured on the surface 3S of the metal layer 3. The average value of L1/S1 of the plurality of the first metal grains 1 may be 1.5 or more and 20 or less, and the average value of L2/S2 of the plurality of the second metal grains 2 may be 1.5 or more and 20 or less. L1/S1 may be rephrased as an aspect ratio of the first metal grain 1. L2/S2 may be rephrased as an aspect ratio of the second metal grain 2. When the averages of each of L1/S1 and L2/S2 is 1.5 or more, by the above mechanism, the peeling-off of the thin film 6 from the metal layer 3 is easily suppressed. When the average of each of L1/S1 and L2/S2 is 20 or less, gaps between the metal grains (gaps between crystals) are easily reduced. Consequently, the peeling-off of the thin film 6 from the metal layer 3 is easily suppressed, and the leak current in the thin film 6 is also easily suppressed. For the above reason, the average of L1/S1 may be 3.0 or more and 20 or less, 5.0 or more and 20 or less, 1.5 or more and 7.0 or less, 3.0 or more and 7.0 or less, or 5.0 or more and 7.0 or less. The average of L2/S2 may be 3.0 or more and 20 or less, 5.0 or more and 20 or less, 1.5 or more and 7.0 or less, 3.0 or more and 7.0 or less, or 5.0 or more and 7.0 or less.

L1 may be, for example, 0.75 µm or more and 2.0 µm or less. S1 may be, for example, 0.1 µm or more and 0.5 µm or less. L2 may be, for example, 0.75 µm or more and 2.0 µm or less. S2 may be, for example, 0.1 µm or more and 0.5 µm or less.

The metal layer 3 may consist only of the first metal grains 1 and the second metal grains 2. As long as the peeling-off of the thin film 6 from the metal layer 3 is suppressed, the metal layer 3 may contain, in addition to the first metal grains 1 and the second metal grains 2, other metal grains (crystals). For example, the metal layer 3 may contain the other metal grains (crystals) extending in directions different from the first direction D1 and the second direction D2 on the surface 3S of the metal layer 3. The metal layer 3 may contain the other metal grains (crystals) having isotropic shapes on the surface 3S of the metal layer 3. A part or the whole of each of the first metal grains, 1 may be amorphous. A part or the whole of each of the first metal grains 1 may be crystalline. A part of each of the first metal grains 1 may be amorphous and the other part thereof may be crystalline. Part of the plurality of the first metal grains 1 may be amorphous and the rest part thereof may be crystalline. From the viewpoint that advantageous effects of the present invention are easily attained, it is preferable that at least a part of each of the first metal grains 1 be crystalline, and it is more preferable that the whole of each of the first metal grains 1 be crystalline. For the same reason, it is preferable that at least part of the plurality of the first metal grains 1 be crystalline, and it is more preferable that all the first metal grains 1 be crystalline. The first metal grain 1 may contain single crystal or polycrystal. The first metal grain 1 may consist only of single crystal or polycrystal. When a part of or the whole of the first metal grain is crystalline, the first metal grain is represented as a "first crystal". A part of or the whole of each of the second metal grains 2 may be amorphous. A part of or the whole of each of the second metal grains 2 may be crystalline. A part of each of the second metal grains 2 may be amorphous and the other part thereof may be crystalline. Part of the plurality of the second metal grains 2 may be amorphous and the rest thereof may be crystalline. From the viewpoint that advantageous effects of the present invention are easily attained, it is preferable that at least a part of each of the second metal grains 2 be crystalline, and it is more preferable that the whole of each of the second metal grains 2 be crystalline. For the same reason, it is preferable that at least part of the plurality of the second metal grains 2 be crystalline, and it is more preferable that all the second metal grains 2 be crystalline. The second metal grain 2 may contain single crystal or polycrystal. The second metal grain 2 may consist only of single crystal or polycrystal. When a part of or the whole of the second metal grain is crystalline, the second metal grain is represented as a "second crystal". Part of or the whole of the first metal grains 1 may be columnar crystals extending along the normal direction DN of the surface 3S of the metal layer 3. Part of or the whole of the second metal grains 2 may be columnar crystals extending along the normal direction DN of the surface 3S of the metal layer 3. One first metal grain 1 may seamlessly continue from the surface 3S of the metal layer 3 to the back surface thereof. One second metal grain 2 may seamlessly continue from the surface 3S of the metal layer 3 to the back surface thereof. The first metal grain 1 may consist of a plurality of crystals connected in the normal direction DN of the surface 3S of the metal layer 3. The second metal grain 2 may consist of a plurality of crystals connected in the normal direction DN of the surface 3S of the metal layer 3. On the surface 3S of the metal layer 3, one portion of the first metal grain 1 may be unified with one portion of the second metal grain 2. That is, on the surface 3S of the metal layer 3, the first metal grain 1 may intersect the second metal grain 2. The shape of the first metal grain 1 illustrated in FIG. 1 is approximately a rectangular parallelepiped, but the shape thereof is not limited. The first metal grain 1 may be, for example, a polygonal prism other than a rectangular parallelepiped. The shape of the second metal grain 2 illustrated in FIG. 1 is approximately a rectangular parallelepiped, but the shape thereof is not limited. The second metal grain 2 may be, for example, a polygonal prism other than a rectangular parallelepiped.

The angle made by the first direction D1 and the second direction D2 may be 90°. Due to that the angle made by the first direction D1 and the second direction D2 is 90°, the metal layer 3 is easy to be compact and the surface area of the metal layer 3 contacting with the thin film 6 is easily increased. Due to that the angle made by the first direction D1 and the second direction D2 is 90°, forces in all directions on the surface 3S of the metal layer 3 are easily relaxed in the first direction D1 and the second direction D2. The angle made by the first direction D1 and the second direction D2 may be an angle other than 90°. When the metal layer 3 has a hexagonal crystal structure, the angle made by the first direction D1 and the second direction D2 may be 60° or 120°. For example, the metal layer 3 consisting of ruthenium has a hexagonal crystal structure (hexagonal close-packed structure).

The metal layer 3 may contain at least one selected from the group consisting of platinum (Pt), iridium (Ir), osmium (Os), rhenium (Re), palladium (Pd), ruthenium (Ru), rhodium (Rh), cobalt (Co), nickel (Ni), gold (Au), silver (Ag), aluminum (Al) and chromium (Cr). The metal layer 3 may be a simple substance of metal or an alloy. The metal layer 3 may contain elements other than metals (for example, inevitable impurities) as long as the crystal structure of each of the first crystals 1 and the second crystals 2 is not impaired. The metal layer 3 may have one crystal structure selected from the group consisting of the face-centered cubic lattice structure, the cubic body-centered lattice structure, the simple cubic lattice structure and the hexagonal close-packed structure. When the metal layer 3 consists of a metal (particularly Pt) having the face-centered cubic lattice structure, the metal layer 3 easily has the plurality of the first crystals 1 extending along [010] of the face-centered cubic lattice structure, and the plurality of the second crystals 2 extending along [001] of the face-centered cubic lattice structure. That is, the [010] of the face-centered cubic lattice structure may be parallel to the first direction D1, and the [001] of the face-centered cubic lattice structure may be parallel to the second direction D2. Alternatively, when the metal layer 3 consists of a metal (particularly Pt) having the face-centered cubic lattice structure, the metal layer 3 easily has the plurality of the first crystals 1 extending along [001] of the face-centered cubic lattice structure, and the plurality of the second crystals 2 extending along [010] of the face-centered cubic lattice structure. That is, the [001] of the face-centered cubic lattice structure may be parallel to the first direction D1, and the [010] of the face-centered cubic lattice structure may be parallel to the second direction D2. The [010] and the [001] each mean a crystal orientation. When the metal layer 3 contains at least one platinum group element selected from the group consisting of Pt, Ir, Os, Pd, Ru and Rh, the metal layer 3 can have a high electroconductivity and together a high corrosion resistance.

The composition of the second electrode layer 7 is not limited as long as having electroconductivity. The composition of the second electrode layer 7 may be, for example, the same as that of the metal layer 3.

The first crystals 1 and the second crystals 2 may each have one crystal structure selected from the group consisting of the face-centered cubic lattice structure, the cubic body-centered lattice structure and the simple cubic lattice structure; and (100) planes of at least part of the first crystals 1 may be oriented in the normal direction DN of the surface 3S of the metal layer 3, and (100) planes of at least part of the second crystals 2 may be oriented in the normal direction DN of the surface 3S of the metal layer 3. In other words, the (100) planes of at least part of the first crystals 1 may be parallel to the surface 3S of the metal layer 3, and the (100) planes of at least part of the second crystals 2 may be parallel to the surface 3S of the metal layer 3. That is, [100] of the crystal structure of at least part of the first crystals 1 may be parallel to the normal direction DN of the surface 3S of the metal layer 3, and [100] of the crystal structure of at least part of the second crystals 2 may be parallel to the normal direction DN of the surface 3S of the metal layer 3. The (100) planes of the whole of the first crystals 1 may be oriented in the normal direction DN of the surface 3S of the metal layer 3, and the (100) planes of the whole of the second crystals 2 may be oriented in the normal direction DN of the surface 3S of the metal layer 3. When the (100) planes of each of the first crystals 1 and the second crystals 2 are oriented in the normal direction DN of the surface 3S of the metal layer 3, an epitaxial film consisting of a dielectric material or a single crystal film of a dielectric material is easily formed as the thin film 6 on the surface 3S of the metal layer 3. Consequently, the thin film 6 easily has excellent physical properties (for example, paraelectricity, piezoelectricity, pyroelectricity and ferroelectricity). Particularly when the dielectric material has a perovskite structure, by the orientation of the (100) planes of each of the first crystals 1 and the second crystals 2 in the normal direction DN of the surface 3S of the metal layer 3, the epitaxial film consisting of the dielectric material or the single crystal film of the dielectric material is easily formed on the surface 3S of the metal layer 3.

Also after the thin film 6 is laminated on the surface 3S of the metal layer 3, the structure of the surface 3S of the metal layer 3 is unlikely to change, and the composition, crystallinity and dimensions of each of the first metal grains 1 and the second metal grains 2 are also unlikely to change.

The thin film 6 may contain a dielectric material. The dielectric material may be one selected from the group consisting of a paraelectric material, a piezoelectric material, a pyroelectric material and a ferroelectric material. The dielectric material (a paraelectric material, piezoelectric material, pyroelectric material, or ferroelectric material) may be, for example, one selected from the group consisting of the following compounds 1 to 19. The thin film 6 may consist only of the dielectric material. The thin film 6 may further contain, in addition to the dielectric material, other elements other than elements constituting the dielectric material.

$BaTiO_3$ (1)

$K_{1-x}Na_xNbO_3 (0<x<1)$ (2)

$LiNbO_3$ (3)

$PbTiO_3$ (4)

$PbZr_xTi_{1-x}O_3 (0<x<1)$ (5)

$Pb_{(1-x)}La_xTi_{1-x/4}O_3 (0<x<1)$ (6)

$Pb_{1-x}La_x(Zr_{1-y}Ti_y)_{1-x/4}O_3 (0<x<1, 0<y<1)$ (7)

$(Na_yBi_{1-y})_{1-x}Ba_xTiO_3 (0<x<1, 0<y<1)$ (8)

$(Bi_xBa_y)_mFe_xTi_yO_3 (xy>0, x+y=1,$ and $m$ is about 1) (9)

$(Bi_xBa_ySr_z)_mFe_xTi_{(y+z)}O_3 (xyz>0, x+y+z=1,$ and $m$ is about 1) (10)

$(Bi_{(x+z)}Ba_y)_mFe_xTi_yAl_zO_3 (xyz>0, x+y+z=1,$ and $m$ is about 1) (11)

$AlN$ (12)

$ZnO$ (13)

$CdS$ (14)

$HfO_2$ (15)

$TiO_2$ (16)

$Ta_2O_5$ (17)

$Al_2O_3$ (18)

$SiO_2$ (19)

The thin film 6 may be an epitaxial film. That is, the thin film 6 may be formed by epitaxial growth. The thin film 6 may be a single crystal. When the thin film 6 is an epitaxial film consisting of a dielectric material or a single crystal of a dielectric material, the thin film 6 easily has excellent physical properties (for example, paraelectricity, piezoelectricity, pyroelectricity or ferroelectricity). The thin film 6 may be polycrystalline. The thin film 6 may contain a plurality of layers.

The dielectric material contained in the thin film 6 may be a metal oxide having a perovskite structure. The metal oxide having a perovskite structure may be one selected from the group consisting of the above compounds 1 to 11. When the dielectric material contained in the thin film 6 is the metal oxide having a perovskite structure, the epitaxial film consisting of a dielectric material or the single crystal of a dielectric material is easily formed on the surface 3S of the metal layer 3. Consequently, the thin film 6 easily has excellent physical properties (for example, paraelectricity, piezoelectricity, pyroelectricity or ferroelectricity).

The adhesion layer 5 has a function of making the metal layer 3 to be adhered to the substrate 4. The adhesion layer 5 may contain zirconium oxide and an oxide of a rare earth element. Because the adhesion layer 5 contains zirconium oxide and the oxide of a rare earth element, the metal layer 3 containing the first metal grains 1 (first crystals) and the second metal grains 2 (second crystals) can easily be formed on the surface of the adhesion layer 5. The rare earth element may be at least one selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). As shown in FIG. 1, the adhesion layer 5 may be one layer consisting of zirconium oxide added with the oxide of a rare earth element. When the adhesion layer 5 consists of an yttria-stabilized zirconia ($ZrO_2$ added with $Y_2O_3$), the metal layer 3 containing the first metal grains 1 (first crystals) and the second metal grains 2 (second crystals) is easily formed on the surface of the adhesion layer 5. As shown in FIG. 4, the adhesion layer 5 may have a first adhesion layer 5A laminated directly on the surface of the substrate 4, and a second adhesion layer 5B laminated directly on the surface of the first adhesion layer 5A. The metal layer 3 may be laminated directly on the surface of the second adhesion layer 5B. The first adhesion layer 5A may consist of zirconium oxide ($ZrO_2$), and the second adhesion layer 5B may consist of yttrium oxide ($Y_2O_3$). When the first adhesion layer 5A consists of $ZrO_2$, and the second adhesion layer 5B consists of $Y_2O_3$, the metal layer 3 containing the first metal grains 1 (first crystals) and the second metal grains 2 (second crystals) is easily formed on the surface of the second adhesion layer 5B.

The thickness of the substrate 4 may be, for example, 50 μm or more and 1000 μm or less. The thickness of the adhesion layer 5 may be, for example, 5 nm or more and 1000 nm or less. The thickness of the metal layer 3 (first electrode layer) may be, for example, 5 nm or more and 500 nm or less. The thickness of the thin film 6 may be, for example, 0.5 μm or more and 10 μm or less. The thickness of the second electrode layer 7 may be, for example, 5 nm or more and 500 nm or less.

The substrate 4 may be, for example, a substrate consisting of a single crystal of silicon (Si), or a substrate consisting of a single crystal of a compound semiconductor such as gallium arsenide (GaAs). The substrate 4 may also be a substrate consisting of a single crystal of an oxide such as MgO. The substrate 4 may also be a substrate consisting of a single crystal of a perovskite-type oxide such as $KTaO_3$. The substrate 4 may consist of a single crystal of Si and the surface of the substrate 4 facing the metal layer 3 may be a (100) plane of Si. When the substrate 4 consists of a single crystal of Si and the surface of the substrate 4 facing the metal layer 3 is a (100) plane of Si, the metal layer 3 containing the first metal grains 1 (first crystals) and the second metal grains 2 (second crystals) is easily formed on the surface of the adhesion layer 5 or substrate 4.

A thin film device according to the present embodiment may comprise the above thin film laminate. The thin film device is an device having a specific function caused by the composition of the thin film 6. The lamination structure of the thin film device may be the same as a lamination structure of the thin film laminate (for example, the lamination structure of the thin film laminate 10 or 10A). The thin film laminate itself (for example, the thin film laminate 10 or 10A) may be a thin film device. Any of specific examples of thin film devices described later may have the thin film laminate 10 or 10A. Any of specific examples of thin film devices described later may be applied to parts of microelectromechanical systems (MEMS).

When the thin film 6 contains a dielectric material, the thin film device may be a thin film capacitor.

When the thin film 6 contains a piezoelectric material, the thin film device may be a piezoelectric thin film device. The piezoelectric material may be one selected from the group consisting of the above compounds 2 to 15. The applications of the piezoelectric thin film device are a wide variety thereof. The piezoelectric thin film device may be applied, for example, to piezoelectric actuators. The piezoelectric actuators may be used, for example, for head sliders (head assemblies), head stack assemblies, or hard disc drives. The piezoelectric actuators may be used, for example, for printer heads, or printer heads of inkjet printers. The piezoelectric actuators may be mirror actuators to drive MEMS mirrors and control the direction of the mirrors. The MEMS mirrors are applied, for example, to optical scanners for laser-scanning video modules. The laser-scanning video modules are applied, for example, to laser-scanning image displays such as head-up displays.

The piezoelectric thin film device may be applied, for example, to piezoelectric sensors. The piezoelectric sensors may be, for example, gyro sensors, pressure sensors, pulse wave sensors, or shock sensors.

The piezoelectric thin film device may be applied, for example, to microphones, speakers, buzzers or resonators.

When the thin film 6 contains a pyroelectric material or a ferroelectric material, the thin film device may be a pyroelectric thin film device. The pyroelectric material or the ferroelectric material may be one selected from the group consisting of the above compounds 4 to 8, and 15. The pyroelectric thin film device may be applied, for example, to infrared detectors (infrared sensors).

The thin film device may be an optical device. The optical device may be, for example, ND filters, optical switch devices or optical waveguide devices. When the thin film 6 contains a dielectric material, the thin film device may be applied to ND filters (neutral density filters). When the thin film device is an ND filter, another metal layer other than the metal layer 3 and another thin film consisting of a dielectric material may be alternately laminated on the surface of the thin film 6. When the thin film device is the ND filter, the dielectric material contained in the thin film 6 may be one selected from the group consisting of the above compounds 16 to 19. When the thin film device is an ND filter, the substrate which the thin film device has may consist of a transparent resin. The ND filters are used, for example, for digital cameras. When the thin film 6 contains $LiNbO_3$ or $Pb_{1-x}La_x(Zr_{1-y}Ti_y)_{1-x/4}O_3$ (the above compound 3 or 7), the thin film 6 has an electrooptic effect. That is, by application of an electric field to the thin film 6, the refractive index of the thin film 6 changes. Therefore, when the thin film 6 contains $LiNbO_3$ or $Pb_{1-x}La_x(Zr_{1-y}Ti_y)_{1-x/4}O_3$, the thin film device may be applied to optical switch devices or optical waveguide devices. The optical switch devices or the optical waveguide devices are used, for example, for optical communication devices, optical measuring devices or optical information processing devices.

A multilayer substrate according to the present embodiment may comprise the above thin film laminate. The lamination structure of the multilayer substrate may be the same as a lamination structure of the thin film laminate (for example, the lamination structure of the thin film laminate 10 or 10A). The multilayer substrate may be a substrate to be used for production of the above thin film device. That is, the thin film device may be produced by processing of the multilayer substrate. A substrate having a plurality of the thin film devices may also be produced by processing of the multilayer substrate. A substrate further having, in addition to the thin film device, another device different from the thin film device may be produced by processing of the multilayer substrate. A MEMS having the thin film device may be produced, for example, by processing of the multilayer substrate. The processing of the multilayer substrate implies a processing method, for example, vapor deposition, annealing, dicing or photolithography (patterning by etching).

Each of the adhesion layer 5, the metal layer 3 (first electrode layer), the thin film 6 and the second electrode layer 7 may be formed in this lamination order on the substrate 4.

Each of the layers and the thin film 6 may be formed in a vacuum chamber. A raw material may be selected in such a way as to correspond to the composition of each of the layers or the thin film 6, and a plurality of raw materials may be combined. The raw material for each of the layers or the thin film 6 may be, for example, a simple substance of metal, an alloy, or another compound such as an oxide. The atmosphere in the vacuum chamber may contain elements (for example, oxygen) constituting each of the layers or the thin film 6. When the metal layer 3 or the second electrode layer 7 is formed, the atmosphere of the vacuum apparatus may be a non-oxidative atmosphere. The non-oxidative atmosphere may be a rare gas (for example, argon) alone, or a mixed gas of a rare gas and nitrogen. The formation method of each of the adhesion layer 5, the metal layer 3 (first electrode layer), the thin film 6 and the second electrode layer 7 may be a vapor phase growth method. The vapor phase growth method may be a physical vapor deposition (PVD) method or a chemical vapor deposition (CVD) method. The physical vapor deposition method may be, for example, a sputtering method, an electron beam vapor deposition method, or a pulsed laser deposition method. The sputtering method may be, for example, an RF magnetron sputtering method. The electron beam vapor deposition method is a technique in which by irradiating a raw material with electron beams generated from an electron gun in vacuum, the raw material is heated to a high temperature to be evaporated and deposited onto a substrate facing the raw material. According to the electron beam vapor deposition method, the crystallinity and the thickness of each of the layers and the thin film 6 are easily controlled at an atomic layer level. It is preferable that the metal layer 3 be formed by the electron beam vapor deposition method. By formation of the metal layer 3 by the electron beam vapor deposition method, the first crystals 1 and the second crystals 2 are easily formed, and the (100) planes of each of the first crystals 1 and the second crystals 2 are easily oriented in the normal direction DN of the surface 3S of the metal layer 3.

It is preferable that the formation method of the metal layer 3 based on the vapor phase growth method have: a first heating step of vapor-depositing a metal onto the surface of the adhesion layer 5 while keeping the temperature of the atmosphere in a vacuum chamber at a first temperature T1; a temperature raising step of raising the temperature of the atmosphere in the vacuum chamber from the first temperature T1 to a second temperature T2 after the first step; and, a second heating step of vapor-depositing the metal onto the surface of the adhesion layer 5 while keeping the temperature of the atmosphere in the vacuum chamber at the second temperature T2 after the temperature raising step. Also in the temperature raising step, the metal may continue to be vapor-deposited on the surface of the adhesion layer 5. As shown in FIG. 3, in the first heating step, a large number of crystal seeds are formed from the metal vapor-deposited on the surface of the adhesion layer 5 and each of the crystal seeds grows to a crystal grain 8. However, only by the first heating step, the first metal grains 1 (first crystals) and the second metal grains 2 (second crystals) are unlikely to be formed. By carrying out the temperature raising step and the second heating step following the first heating step, the first metal grains 1 (first crystals) and the second metal grains 2 (second crystals) are easily formed. The first temperature T1 is a temperature at which the large number of crystal seeds are formed from the metal vapor-deposited on the surface of the adhesion layer 5 and each of the crystal seeds grows to the crystal grain 8. When the first temperature T1 is too high, the crystal grains 8 grow excessively; the first metal grains 1 (first crystals) and the second metal grains 2 (second crystals) are unlikely to be formed; and the surface roughness of the metal layer 3 becomes excessively high. The second temperature T2 is a temperature at which the plurality of the crystal grains 8 formed on the surface of the adhesion layer 5 are connected to each other and the first metal grains 1 (first crystals) and the second metal grains 2 (second crystals) each grow. When the second temperature T2 is too high, the crystal grains 8 grow excessively; the first metal grains 1 (first crystals) and the second metal grains 2 (second crystals) are unlikely to be formed; and the surface roughness of the metal layer 3 becomes excessively high.

According to the first heating step, the temperature raising step and the second heating step, the first metal grains 1 (first crystals) and the second metal grains 2 (second crystals) are easily formed; the (100) planes of each of the first crystals 1 and the second crystals 2 are easily oriented in the normal direction DN of the surface 3S of the metal layer 3; and the (111) planes of each of the first crystals 1 and the second crystals 2 are unlikely to be oriented in the normal direction DN of the surface 3S of the metal layer 3. In the first heating step, the temperature raising step and the second heating step, a trace amount of oxygen gas that does not oxidize the metal layer may be supplied into the vacuum chamber. By the supply of oxygen gas, the (100) planes of each of the first crystals 1 and the second crystals 2 are easily oriented in the normal direction DN of the surface 3S of the metal layer 3, and the (111) planes of each of the first crystals 1 and the second crystals 2 are unlikely to be oriented in the normal direction DN of the surface 3S of the metal layer 3.

Either of the first temperature T1 and the second temperature T2 is not limited since they depend on the composition of the metal layer 3. Either of the first temperature T1 and the second temperature T2 may be specified by experiments. For example, when the metal layer 3 consists of Pt, the first temperature T1 may be about 600° C., and the second temperature T2 may be 610° C. or more and 650° C. or less. The time required for the temperature raising step may be, for example, 1 minute or more and 5 minutes or less. The first temperature T1 may be a temperature of the substrate 4 in the first heating step. The second temperature T2 may be a temperature of the substrate 4 in the second heating step.

The crystal structure of each of the adhesion layer 5, the metal layer 3 (first electrode layer), the thin film 6 and the second electrode layer 7 may be specified by an X-ray diffraction (XRD) method. The first metal grains 1 and the second metal grains 2 exposed on the surface 3S of the metal layer 3 may be observed by an atomic force microscope (AFM). The dimensions of each of the first metal grains 1 and the second metal grains 2 may be measured by an AFM. The composition of each of the layers and the thin film 6 may be specified by at least one analysis method among an X-ray fluorescence analysis (XRF) method, an energy dispersive X-ray spectroscopy (EDX), an induced coupled plasma mass spectroscopy (ICP-MS), a laser ablation induced coupled plasma mass spectroscopy (LA-ICP-MS) and an analysis method using an electron probe microanalyzer (EPMA).

EXAMPLES

Hereinafter, the present invention will be described in more detail by way of Examples and Comparative Examples, but the present invention is not any more limited to these Examples.

Example 1

A Si single crystal substrate was used for fabrication of a thin film laminate. The surface of the single crystal substrate was a (100) plane of Si. The single crystal substrate was a disc of 3 inches (76.2 mm) in diameter. The thickness of the single crystal substrate was 400 μm.

In a vacuum chamber, a first adhesion layer consisting of $ZrO_2$ was formed on the entire surface of the single crystal substrate. The first adhesion layer was formed by an electron beam vapor deposition method. In the formation process of the first adhesion layer, the temperature of the substrate was kept at 870° C. In the formation process of the first adhesion layer, the flow volume of the oxygen gas supplied to the vacuum chamber was adjusted to 10 sccm. The growth rate (increasing rate of the thickness of the first adhesion layer) of $ZrO_2$ was adjusted to 0.6 to 0.67 Å/sec. The thickness of the first adhesion layer was about 20 nm.

In the vacuum chamber, a second adhesion layer consisting of $Y_2O_3$ was formed on the entire surface of the first adhesion layer. The second adhesion layer was formed by an electron beam vapor deposition method. In the formation process of the second adhesion layer, the temperature of the substrate was kept at 870° C. In the formation process of the second adhesion layer, the flow volume of the oxygen gas supplied to the vacuum chamber was adjusted to 14 sccm. The growth rate (increasing rate of the thickness of the second adhesion layer) of $Y_2O_3$ was adjusted to 0.65 Å/sec. The thickness of the second adhesion layer was about 45 nm.

By an electron beam vapor deposition method consisting of a first heating step, a temperature raising step and a second heating step, a metal layer consisting of Pt was formed on the entire surface of the second adhesion layer.

In the first heating step, Pt was vapor-deposited on the surface of the second adhesion layer while the temperature of the atmosphere in the vacuum chamber was kept at a first temperature T1. The first temperature T1 is shown in the following Table 1. The first heating step was continued for 10 min.

In the temperature raising step following the first heating step, the temperature of the atmosphere in the vacuum chamber was raised from the first temperature T1 to a second temperature T2. The second temperature T2 is shown in the following Table 1. The time required for the temperature raising step was 3 minutes. Also in the temperature raising step, Pt was continuously vapor-deposited on the surface of the second adhesion layer.

In the second heating step following the temperature raising step, Pt was vapor-deposited on the surface of the adhesion layer 5 while the temperature of the atmosphere in the vacuum chamber was held at the second temperature T2. The second temperature T2 is shown in the following Table 1. The second heating step was continued for 20 minutes.

In the formation process of the metal layer, the flow volume of the oxygen gas supplied to the vacuum chamber was adjusted to 5 sccm. The growth rate (increasing rate of the thickness of the metal layer) of the metal layer was adjusted to 0.5 to 0.8 Å/sec.

By the above method, the metal layer consisting of Pt was formed. The thickness of the metal layer was about 50 nm. A part of the surface of the metal layer was observed by an AFM. The dimensions of a region of the surface of the metal layer observed by the AFM were 5 μm×5 μm. A surface 3S of the metal layer 3 as shown in FIG. 2 was observed by the AFM. That is, the metal layer 3 contained a plurality of first crystals 1 (first metal grains) and a plurality of second crystals 2 (second metal grains). The angle made by the first direction D1 and the second direction D2 was 90°. 10 first crystals 1 exposed on the surface 3S of the metal layer 3 were randomly selected and L1 and S1 of each of the 10 first crystals 1 were measured on the surface of the metal layer. L1 was about 0.9 μm or more and 2.2 μm or less. S1 was about 0.15 μm or more and 0.3 μm or less. 10 second crystals 2 exposed on the surface 3S of the metal layer 3 were randomly selected and L2 and S2 of each of the 10 second crystals 2 were measured on the surface of the metal layer. L2 was about 1.0 μm or more and 2.3 μm or less. S2 was about 0.15 μm or more and 0.4 μm or less. L1/S1 of each of the 10 first crystals 1 was calculated and the average value of L1/S1 was calculated from these values. The average value of L1/S1 is shown in the following Table 1. L2/S2 of each of the 10 second crystals 2 was calculated and the average value of L2/S2 was calculated from these values. The average value of L2/S2 is shown in the following Table 1. It is preferable that the average values of L1/S1 and L2/S2 be each 1.5 or more.

The crystal structure of the metal layer was analyzed by an XRD method. As a result, diffracted X-rays indicating that (100) planes of a face-centered cubic lattice structure of Pt were parallel to the surface of the metal layer were detected. That is, it was implied that the (100) planes of each of the first crystals and the second crystals were oriented in the normal direction of the surface of the metal layer.

A thin film (KNN film) consisting of $(K_{0.5}Na_{0.5})NbO_3$ was formed on the entire surface of the metal layer in the vacuum chamber. The KNN film was formed by a sputtering method. $(K_{0.5}Na_{0.5})NbO_3$ was used as the sputtering target. The temperature of the atmosphere in the vacuum chamber was kept at 550° C. The atmosphere in the vacuum chamber was a mixed gas of Ar and $O_2$. The thickness of the KNN film was adjusted to 2000 nm.

The crystal structure of the KNN film was analyzed by an XRD method. As a result, diffracted X-rays indicating that the surface of the KNN film was a (110) plane of a perovskite structure were detected. That is, it was implied that the (110) planes of the perovskite structure of the KNN film were oriented in the normal direction DN of the surface 3S of the metal layer 3.

A thin film laminate of Example 1 was fabricated by the above method. The thin film laminate had the substrate, the first adhesion layer laminated directly on the surface of the substrate, the second adhesion layer laminated directly on the surface of the first adhesion layer, the metal layer laminated directly on the surface of the second adhesion layer, and the thin film (KNN film) laminated directly on the surface of the metal layer. In order to calculate the following peeling-off ratio, 10 thin film laminates of Example 1 were fabricated.

[Peeling Ratio]

The peeling ratio Rp (unit: %) of the KNN films was calculated by using the 10 thin film laminates of Example 1. The peeling ratio Rp of the KNN films was measured by the following cross hatch test. The cross hatch test is a method according to JIS K5600-5-6:1999 (ISO 2409:1992). In the cross hatch test, a plurality of cross hatch cuts orthogonal to each other were formed on the surface of the KNN film to divide the KNN film into 100 lattice sections (squares). The cutting interval was 1 mm. After the formation of the lattice sections, a pressure-sensitive adhesive tape was applied on the entire surface of the KNN film. The number N of the lattice sections having at least part of the KNN film peeled off from the surface of the metal layer by accompanying peeling-off of the pressure-sensitive adhesive tape from the KNN film was counted. N is the peeling ratio Rp itself. The peeling ratio Rp is classified into 4 ranks of A, B, C and D. A means that the peeling ratio Rp was 0% or more and less than 10%. B means that the peeling ratio Rp was 10% or more and less than 20%. C means that the peeling ratio Rp was 20% or more and less than 50%. D means that the peeling ratio Rp was 50% or more and 100% or less. It is preferable that the rank of the peeling ratio Rp be A or B, and it is most preferable that the rank of the peeling ratio Rp be A. The rank of the peeling ratio Rp of Example 1 is shown in the following Table 1.

The withstand voltage (unit: V/μm) of the KNN film of Example 1 was measured. An electrometer (R8340) manufactured by Advantest Corp was used as the measuring instrument. In the measurement, a second electrode layer was formed as a counter electrode of the metal layer which the thin film laminate had, on the surface of the KNN film. A voltage applied to the KNN film was raised from 0 V at intervals of 5 V; and a voltage at which the insulation of the KNN film was broken down was measured as the withstand voltage Vbd. It is preferable that the withstand voltage Vbd be 50 V/μm or more. The withstand voltage Vbd is shown in the following Table 1.

Examples 2 to 7, and Comparative Examples 1 to 3

The second temperature T2 of each of Examples 2 to 7 and Comparative Example 1 was adjusted to a temperature shown in the following Table 1.

In the case of Example 5, a metal layer consisting of Ir was formed in place of a metal layer consisting of Pt.

In the case of Example 6, a metal layer consisting of Pd was formed in place of the metal layer consisting of Pt.

In the case of Example 7, a metal layer consisting of Ag and Pd was formed in place of the metal layer consisting of Pt.

In the formation process of the metal layer of Comparative Example 2, the temperature in the vacuum chamber was kept consistently at 700° C. That is, in the formation process of the metal layer of Comparative Example 2, no temperature raising step was carried out.

In the formation process of the metal layer of Comparative Example 3, the temperature in the vacuum chamber was kept consistently at 630° C. That is, in the formation process of the metal layer of Comparative Example 3, no temperature raising step was carried out.

A thin film laminate of each of Examples 2 to 7 and Comparative Examples 1 to 3 was individually fabricated by the same method as in Example 1, except for the above items.

The metal layer of each of Examples 2 to 7 and Comparative Examples 1 to 3 was observed by the same method using an AFM as in Example 1. The crystal structure of the metal layer of each of Examples 2 to 7 and Comparative Examples 1 to 3 was analyzed by the same method as in Example 1.

In any case of Examples 2 to 7, the metal layer contained a plurality of first crystals and a plurality of second crystals. The angle made by the first direction D1 and the second direction D2 was 90°. L1, S1, L2 and S2 of each of Examples 2 to 7 were measured. The average values of L1/S1 of each of Examples 2 to 7 are shown in the following Table 1. The average values of L2/S2 of each of Examples 2 to 7 are shown in the following Table 1.

In any case of Examples 2 to 7, a diffracted X-rays indicating that the (100) planes of the face-centered cubic lattice structure of the metal layer were parallel to the surface of the metal layer were detected. That is, it was implied that the (100) planes of each of the first crystals and the second crystals were oriented in the normal direction DN of the surface of the metal layer.

The metal layer of each of Comparative Examples 1 to 3 contained neither of the first crystals and the second crystals. The aspect ratio of the crystal grains on the surface of the metal layer of each of Comparative Examples 1 to 3 was about 1.0. There were variations in the grain diameters of the crystal grains on the surface of the metal layer of Comparative Example 1. On the surface of the metal layer of each of Comparative Examples 2 and 3, coarse crystal grains were observed. In the case of Comparative Examples 2 and 3, it is presumed that the coarse crystal grains were formed in the early stage of the formation process of the metal layers.

The peeling ratio Rp of each of Examples 2 to 7 and Comparative Examples 1 to 3 was calculated by the same method as in Example 1. The rank of the peeling ratio Rp of each of Examples 2 to 7 and Comparative Examples 1 to 3 is shown in the following Table 1. The withstand voltage Vbd of each of Examples 2 to 7 and Comparative Examples 1 to 3 was measured by the same method as in Example 1. The withstand voltage Vbd of each of Examples 2 to 7 and Comparative Examples 1 to 3 is shown in the following Table 1.

TABLE 1

| | Metal Layer Composition [—] | First Heating Step T1 [° C.] | Second Heating Step T2 [° C.] | First Crystal L1/S1 [—] | Second Crystal L2/S2 [—] | Peeling Ratio Rp [%] | Withstand Voltage Vbd [V/μm] |
|---|---|---|---|---|---|---|---|
| Example 1 | Pt | 600 | 650 | 5 | 5 | B | 114 |
| Example 2 | Pt | 600 | 640 | 7 | 7 | A | 127 |
| Example 3 | Pt | 600 | 630 | 5 | 5 | B | 112 |
| Example 4 | Pt | 600 | 610 | 1.5 | 1.5 | B | 90 |
| Example 5 | Ir | 600 | 630 | 4 | 4 | B | 80 |
| Example 6 | Pd | 600 | 630 | 3 | 3 | B | 76 |
| Example 7 | Ag—Pd | 600 | 630 | 3 | 3 | B | 69 |
| Comparative Example 1 | Pt | 600 | 700 | — | — | D | 32 |
| Comparative Example 2 | Pt | 700 | 700 | — | — | D | 29 |
| Comparative Example 3 | Pt | 630 | 630 | — | — | C | 36 |

The thin film laminate according to the present invention is used, for example, as a piezoelectric thin film device, a pyroelectric thin film device or a ferroelectric thin film device.

REFERENCE SIGNS LIST

1 . . . FIRST METAL GRAIN (FIRST CRYSTAL), 2 . . . SECOND METAL GRAIN (SECOND CRYSTAL), 3 . . . METAL LAYER, 3S SURFACE OF METAL LAYER, 4 . . . SUBSTRATE, 5 . . . ADHESION LAYER, 5A . . . FIRST ADHESION LAYER, 5B . . . SECOND ADHESION LAYER, 6 . . . THIN FILM, 7 . . . SECOND ELECTRODE LAYER, 8 . . . CRYSTAL GRAIN, 10, 10A . . . THIN FILM LAMINATE (THIN FILM DEVICE, MULTILAYER SUBSTRATE), D1 . . . FIRST DIRECTION, D2 . . . SECOND DIRECTION, and DN . . . NORMAL DIRECTION

What is claimed is:

1. A thin film laminate comprising:
a metal layer consisting of a metal; and
a thin film laminated on a surface of the metal layer, wherein
a first direction is defined as one direction parallel to the surface of the metal layer, and
a second direction is defined as one direction parallel to the surface of the metal layer and crossing the first direction;
  the metal layer contains:
    a plurality of first metal grains consisting of the metal and extending in the first direction on the surface of the metal layer; and
    a plurality of second metal grains consisting of the metal and extending in the second direction on the surface of the metal layer, wherein
the first metal grains are first crystals consisting of the metal,
the second metal grains are second crystals consisting of the metal,
(100) planes of at least part of the first crystals are oriented in a normal direction of the surface of the metal layer, and
(100) planes of at least part of the second crystals are oriented in the normal direction of the surface of the metal layer.

2. The thin film laminate according to claim 1, wherein
a width of the first metal grain in the first direction is represented as L1;
a width of the first metal grain in a direction parallel to the surface of the metal layer and perpendicular to the first direction is represented as S1;
a width of the second metal grain in the second direction is represented as L2;
a width of the second metal grain in a direction parallel to the surface of the metal layer and perpendicular to the second direction is represented as S2;
an average value of L1/S1 of the plurality of first metal grains is 1.5 or more and 20 or less; and
an average value of L2/S2 of the plurality of second metal grains is 1.5 or more and 20 or less.

3. The thin film laminate according to claim 1, wherein the metal layer contains at least one selected from the group consisting of platinum, iridium, osmium, rhenium, palladium, ruthenium, rhodium, cobalt, nickel, gold and silver.

4. The thin film laminate according to claim 1, wherein the thin film contains a dielectric material.

5. The thin film laminate according to claim 4, wherein the dielectric material is one selected from the group consisting of a paraelectric material, a piezoelectric material, a pyroelectric material and a ferroelectric material.

6. The thin film laminate according to claim 4, wherein the dielectric material is a metal oxide having a perovskite structure.

7. The thin film laminate according to claim 1, wherein the thin film is an epitaxial film.

8. The thin film laminate according to claim 1, wherein
the metal layer is a first electrode layer; and
the thin film laminate further comprises a second electrode layer laminated on a surface of the thin film.

9. The thin film laminate according to claim 1, wherein an angle made by the first direction and the second direction is 90°.

10. The thin film laminate according to claim 1, comprising:
a substrate;
an adhesion layer laminated on a surface of the substrate;
the metal layer laminated on a surface of the adhesion layer; and
the thin film laminated on a surface of the metal layer,
wherein the adhesion layer contains zirconium oxide and an oxide of a rare earth element.

11. A thin film device comprising the thin film laminate according to claim 1.

12. A multilayer substrate comprising the thin film laminate according to claim 1,
wherein the multilayer substrate is used for production of a thin film device.

* * * * *